United States Patent
Yurick et al.

(10) Patent No.: US 10,514,434 B2
(45) Date of Patent: Dec. 24, 2019

(54) CALIBRATION FOR COMMON MODE CURRENT

(71) Applicant: KEITHLEY INSTRUMENTS, LLC, Solon, OH (US)

(72) Inventors: Benjamin J. Yurick, Garrettsville, OH (US); James A. Niemann, Chagrin Falls, OH (US)

(73) Assignee: KEITHLEY INSTRUMENTS, LLC, Solon, OH (US)

( * ) Notice: Subject to any disclaimer, the term of this patent is extended or adjusted under 35 U.S.C. 154(b) by 97 days.

(21) Appl. No.: 15/425,682

(22) Filed: Feb. 6, 2017

(65) Prior Publication Data
US 2018/0224515 A1 Aug. 9, 2018

(51) Int. Cl.
G01R 35/00 (2006.01)
G01R 15/14 (2006.01)

(52) U.S. Cl.
CPC ............ G01R 35/00 (2013.01); G01R 15/14 (2013.01)

(58) Field of Classification Search
CPC .......... G01R 1/20; G01R 35/00; G01R 15/14; H04B 3/28; H02M 1/143; H02M 2001/123
USPC ........ 307/89, 90; 324/123 R, 127, 130, 132; 333/12; 327/551–559, 130; 330/258
See application file for complete search history.

(56) References Cited

U.S. PATENT DOCUMENTS

| | | | | |
|---|---|---|---|---|
| 5,077,486 A | * | 12/1991 | Marson | C23F 13/04 204/196.03 |
| 5,353,212 A | * | 10/1994 | Loftus, Jr. | H02M 3/33592 363/127 |
| 5,414,348 A | * | 5/1995 | Niemann | G01R 1/30 324/127 |
| 7,365,600 B1 | * | 4/2008 | Lokere | H03F 3/45085 330/258 |
| 8,139,759 B2 | * | 3/2012 | Ichihara | H04B 3/30 307/90 |
| 8,891,595 B1 | * | 11/2014 | Farjadrad | H04L 12/10 375/219 |
| 10,069,400 B1 | * | 9/2018 | Morgan, Jr. | H02M 1/12 |
| 10,320,279 B2 | * | 6/2019 | Cheng | H02M 1/12 |
| 2006/0187004 A1 | * | 8/2006 | Vollmer | H04B 3/28 307/3 |
| 2007/0091648 A1 | * | 4/2007 | Johnston | H02M 1/14 363/16 |
| 2008/0048779 A1 | * | 2/2008 | Crawley | H03F 1/26 330/258 |
| 2012/0063173 A1 | * | 3/2012 | Fu | H02M 3/28 363/21.02 |
| 2013/0235619 A1 | * | 9/2013 | Zhou | H01F 27/2885 363/21.04 |

\* cited by examiner

*Primary Examiner* — Steven L Yeninas
(74) *Attorney, Agent, or Firm* — Miller Nash Graham & Dunn; Andrew J. Harrington (57) ABSTRACT

A mechanism is disclosed for mitigating common mode current in a test and measurement device. A measurement current can be received from a device under test via a measurement lead that couples a transformer in the test and measurement device with the device under test. The test and measurement device can then be calibrated to apply a nulling current to cancel the common mode current from the measurement current. Other embodiments can be described and/or claimed herein.

11 Claims, 6 Drawing Sheets

CALIBRATION FOR COMMON MODE CURRENT

FIELD OF THE INVENTION

This disclosure is directed to a system and methods for testing signals, and, more particularly, to a mechanism for calibrating a test and measurement system to account for common mode currents.

BACKGROUND

Test and measurement systems are designed to receive and test signals. For example, a test and measurement system may be coupled to a device under test (DUT) to determine the current state of the DUT for testing purposes. For example, the test and measurement system may test a voltage, current, resistance, or other electrical properties of a circuit in a DUT for debugging purposes. Electrical circuits outside of the DUT may cause an electrical effect inside the DUT. Such effects should be mitigated, removed, and/or minimized to provide accurate testing data. For example, a DUT may be electrically isolated to mitigate unwanted signal noise. In some cases, particularly when operating at high frequency, the test and measurement system may generate signal noise. Such noise may enter the DUT and/or the test data, which may cause unwanted effects in the DUT and lead to inaccurate test results.

Aspects of the invention address these and other issues.

DETAILED DESCRIPTION

Test and measurement equipment is expected to possess a certain amount of immunity to common impedance noise caused from common impedance coupling. In some cases, interference, noise, and/or unwanted signal(s) related to common impedance coupling may occur when the measurement equipment is chassis or earth ground referenced. Common impedance coupling describes how two circuits interact with one another when they share a common impedance. Most chassis referenced common impedance noise sources originate outside the test and measurement equipment. However, some components may originate noise inside the test and measurement system. Internal noise sources should be reduced or minimized because the end user may not be able to overcome errors from internal common mode noise sources. Common mode current is one such source of error. Common mode current may result from employing power from a power line voltage through a transformer. No matter how well the transformer is shielded, some current may couple from the primary side of the transformer (e.g. the power line side) to the secondary side (e.g. the test side) or vice versa. These currents may flow through a common mode impedance with the measurement circuit and/or through the DUT. If this happens, some part of this unwanted signal is measured along with the desired signal measurement. The higher the bandwidth of the desired measurement, the more severe the consequences of this unintended coupling can be.

Disclosed herein are mechanisms to compensate for common mode current occurring in a measurement current. A test and measurement system, such as a DMM, coupled to a power line via a transformer may receive common mode current due to a common impedance relative to a ground system. A nulling current can be generated by utilizing, or employing, output from the transformer. Such nulling current can be applied to a measurement current to cancel, or mitigate, the effects of the common mode current. In one aspect, the transformer may include a center connection for forwarding and receiving the measurement current to and from the DUT. A first phase connection and a second phase connection from the transformer can be coupled to a resistive network. The output from the resistive network can be amplified by an amplifier and applied to a capacitive element to null the common mode current. The resistive network can contain resistors selected during calibration of the test and measurement system, or the measurement circuit. The resistors can be selected to provide a ratio of resistance to generate the nulling current of appropriate phase to cancel the common mode current. The nulling current can then be amplified to obtain an appropriate amplitude for canceling the common mode current. In another aspect, the first phase connection and the second phase connection can be coupled via a switch network controlled by a processing circuit. The processing circuit can employ a duty cycle for switching between the connections as needed to generate a nulling current that charges the capacitive element to an appropriate charge amount to cancel the common mode current. A line sensing element can be further employed to correct the phase and amplitude of the nulling signal. Further, a filter can be employed to remove high frequency content from the nulling current. The filter may be, for example, a Bessel filter, which may employ a maximally linear response, and hence preserve the phase of the nulling current operating in the pass band. In either aspect, the nulling current acts to cancel, or reduce, the common mode current from the measurement current, which allows for more accurate measurement of circuitry and signals in the DUT.

Figure 1:
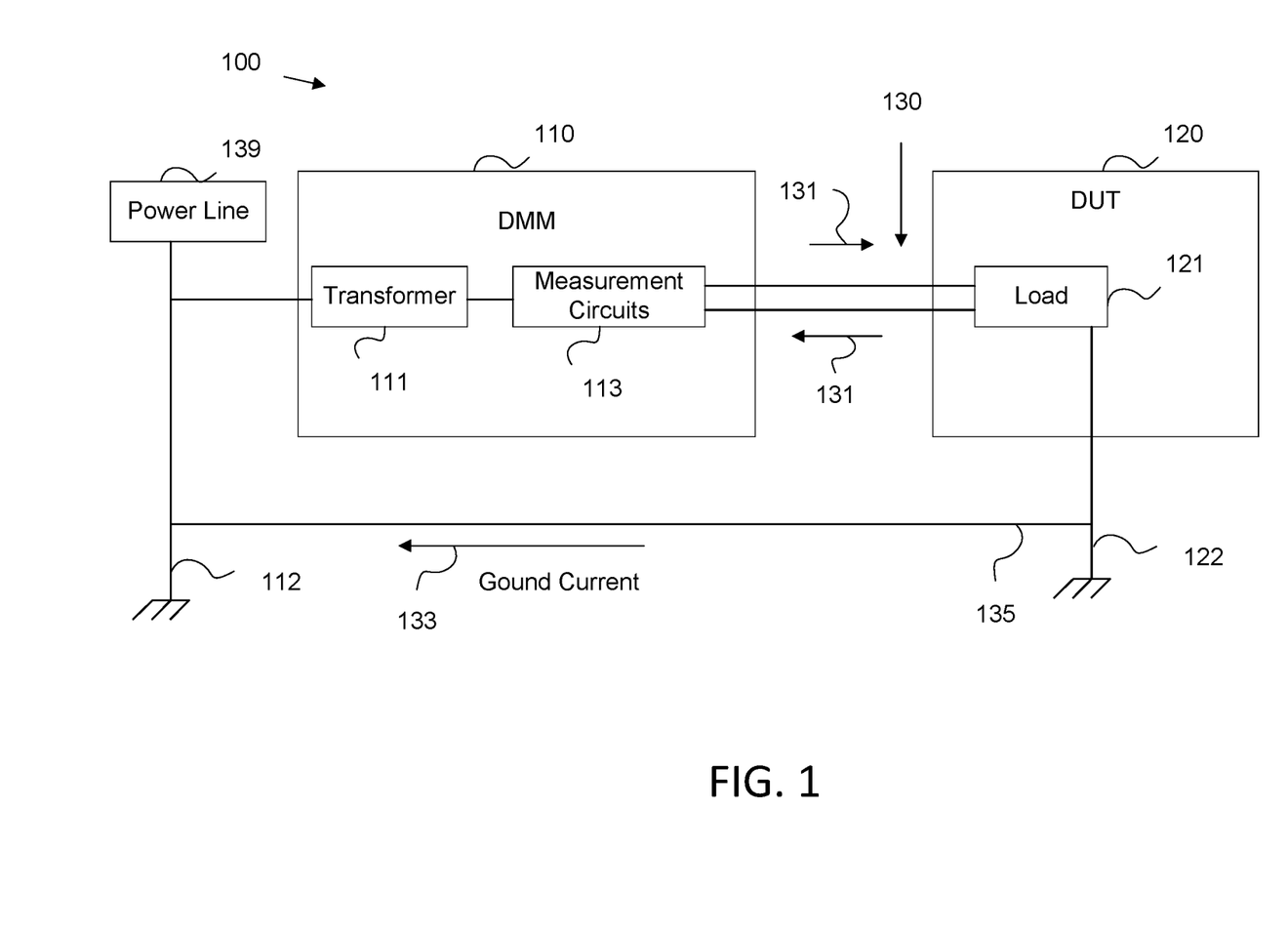
FIG. 1 is a block diagram of an aspect of a test and measurement system coupled to a DUT with a common impedance with a ground connection, in accordance with various embodiments of the present disclosure.

FIG. 1 is a block diagram of an aspect of a test and measurement system 100 coupled to a DUT 120 with a common impedance with a ground connection 135. System 100 includes a DMM 110 for testing the DUT 120 via measurement leads 130.

A DMM 110 is any diagnostic tool employable to test electrical properties in a DUT 120. Such electrical properties may include voltage, current, and/or resistance, in units of volts, amps, and ohms, respectively. The DMM 110 includes a transformer 111 for receiving power from a power line 139 and measurement circuits 113 for measuring measurement current 131 received from the DUT 120. A transformer 111 is any device that transfers electrical energy between two or more circuits via electromagnetic induction. The transformer 111 may decrease alternating current (AC) voltage from the high voltage received from the power line 139 to a low voltage usable by the DMM 110. The transformer 111 may also be coupled to a ground 112 to complete the circuit with the power line 139 to allow current to flow. Ground 112 may be an earth ground or a chassis referenced ground. The measurement circuits 113 may include any circuits desired to transmit, receive, and/or sample measurement currents 131 from the DUT 120 to determine electrical properties of the DUT 120.

The DUT 120 is any device configured to provide and/or modify an electrical signal for testing purposes. For example, the DMM 110 may employ measurement leads 130, which may act as signal probes. The measurement leads 130 may conduct a measurement current 131 to and from the DUT 120. The DUT 120 may include a load 121, which represents any device circuitry to be tested. The measurement current 131 is forwarded across the load and returned to the measurement circuits 113 in the DMM 110. The measurement circuits 113 may compare the changes to the measurement current 131 across the load 121 to determine the electrical properties of the load 121 for display to a user.

As shown, the DUT 120 may also be connected to a ground 122 to complete other operations. The ground 122 and ground 112 may be directly electrically coupled via a ground connection 135 as shown, which allows ground current 133 to flow between the grounds 122 and 112. Alternatively, the DMM 110 may be chassis grounded. Even in such a case, potential differences between ground 112 and ground 122 may create a current source. In either case, the current source from the ground connection 135 exerts an electrical influence on the measurement leads 130. Accordingly, the measurement leads 130 act as a common impedance between the circuit formed by the DMM's 110 measuring equipment and the DUT 120 and between the grounds 122 and 112. As such, common mode current may be carried in the measurement current 131 and may affect the DUT 120 and/or the measurements made by the measurement circuits 113. Common mode impedance and common mode current are discussed more thoroughly in the following aspect.

Figure 2:
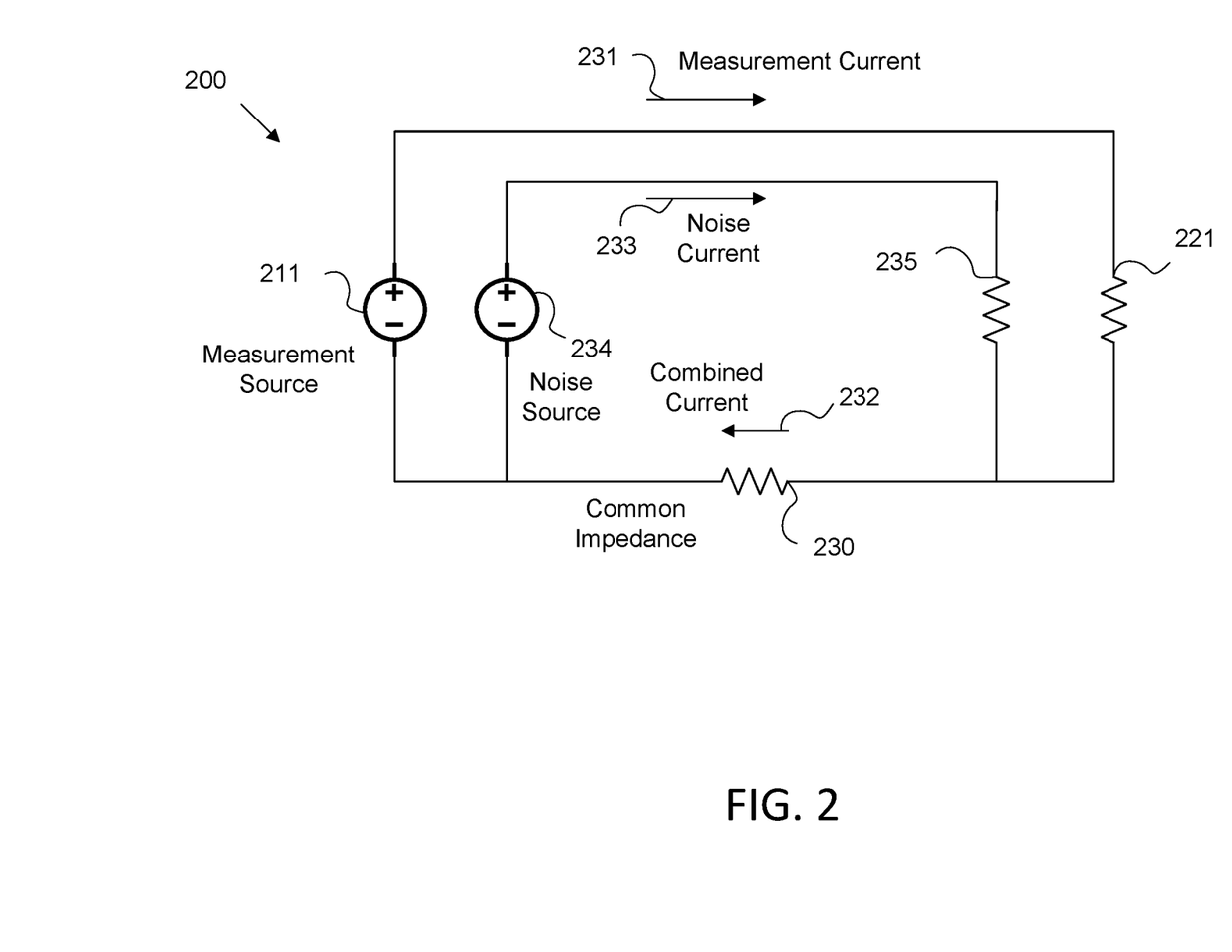
FIG. 2 is a circuit diagram of an aspect of an electrical circuit including a common impedance, in accordance with various embodiments of the present disclosure.

FIG. 2 is a circuit diagram of an aspect of an electrical circuit 200 including a common impedance 230, such as, for example, a common impedance over measurement lead 130 of FIG. 1. The measurement circuit, depicted as the outer loop, employs a measurement source 211, a measurement current 231, and a measurement load 221, which is depicted as a resistor. The measurement source 211 may be any power source for measuring the measurement load 221. The measurement current 231 may be similar to measurement current 131 of FIG. 1, and the measurement load 221 may be a load in a DUT, such as measurement load 121 of FIG. 1. The inner circuit loop may be caused by a coupling between the devices via the ground connection 235 and may include a source of common mode noise. The ground connection 235, which may be similar to ground connection 135 of FIG. 1, is represented as a resistor. A differential voltage across the ground connection 235 effectively creates a noise source 234, which results in a noise current 233. The noise current 233 then combines with the measurement current 231 across a common impedance to create a combined current 232. As noted above, a measurement lead, such as measurement lead 130 of FIG. 1, may act as a common impedance 230, and may hence conduct a combined current 232. Measurement of the combined current 232 at a test system results in an erroneous result because the combined current 232 contains common mode noise from noise current 233 in addition to the measurement current 231. As such, the value of the noise current 233 should be canceled from the combined current 232 to arrive at an accurate measurement.

Figure 3:
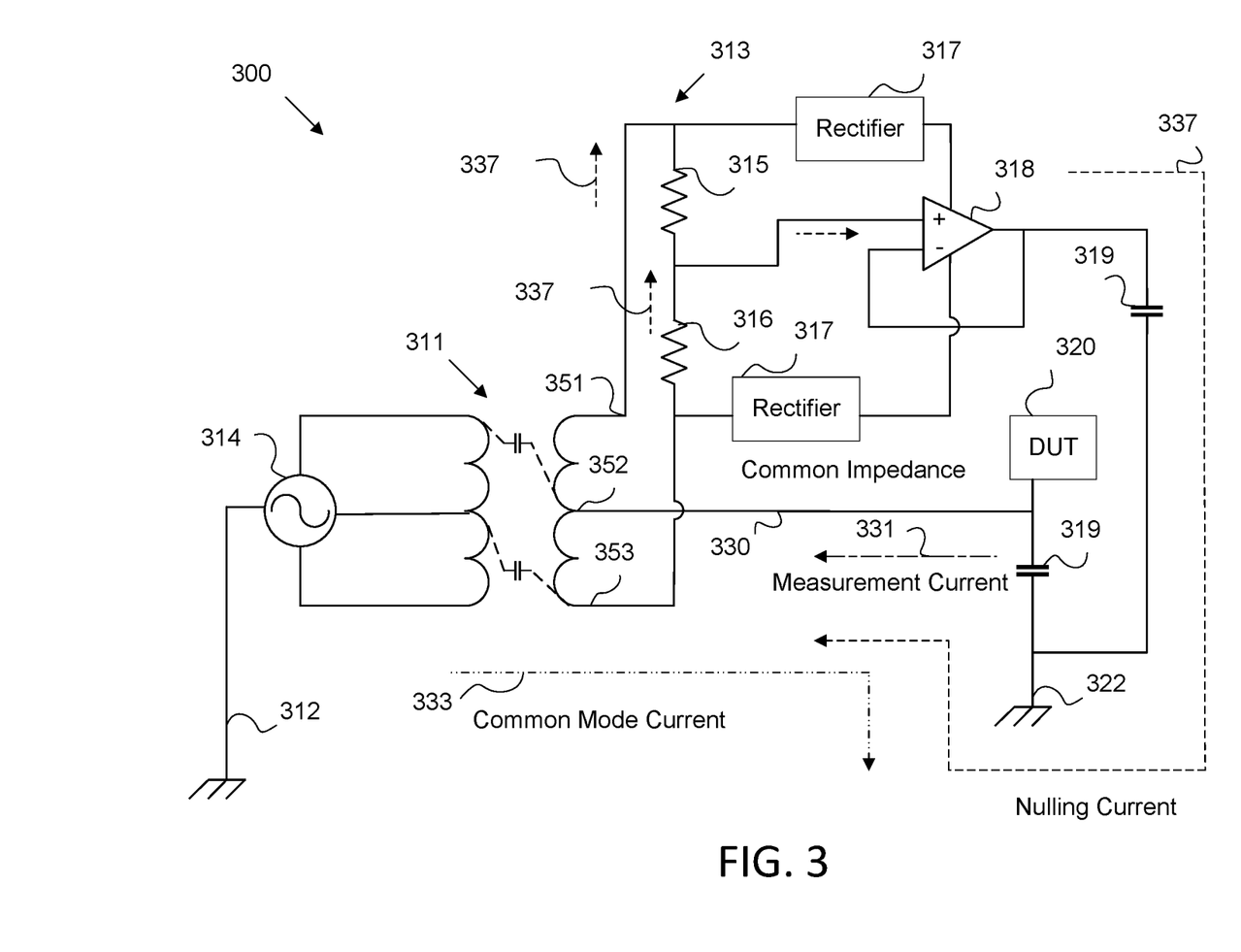
FIG. 3 is a schematic diagram of an aspect of a test and measurement system circuit for employing a resistive network to generate a nulling current to cancel a common mode current, in accordance with various embodiments of the present disclosure.

FIG. 3 is a schematic diagram of an aspect of a circuit of a test and measurement system 300 for employing a resistive network 313 to generate a nulling current to cancel a common mode current 333. The system 300 may be implemented in a test system, such as a DMM 110. The system 300 tests a DUT 320 coupled to a ground 322, which may be similar to DUT 120 and ground 122 of FIG. 1, respectively. The system 300 employs a power source 314 and a ground 312 coupled to a transformer 311, which may be similar to power line 139, transformer 111, and ground 112, respectively.

The transformer 311 includes a primary side that receives power from power source 314 and a secondary side that propagates power toward the DUT 320 across a measurement lead containing a common impedance 330, which is similar to common impedance 230. The transformer 311 may be a two phase transformer, and hence may convert power from the power source 314 into two phase power on the secondary side. The transformer 311 can also step the voltage down for use by the remainder of the system. The transformer 311 includes a first phase connection 351, a second phase connection 353, and a center connection 352 on the secondary side. The currents traversing the transformer may alternate between the connections in two phases.

The center connection 352 forwards a measurement current 331 toward the DUT 320 via the measurement lead containing the common impedance 330 and receives the measurement current 331 for testing. As noted above, the ground 312 and the ground 322 may be coupled by a grounding system. Hence, grounds 312 and 322 may act as a ground connection that allows a common mode current 333 to flow between the testing device and the DUT 320 across the common impedance 330 with the ground connection (e.g. via the measurement leads). Also as noted above, the common mode current 333 may alter the measurement current 331, which may result in inaccurate measurements. The common mode current 333 may be limited by the current's ability to traverse the electrostatic couplings between each side of the transformer 311. The common mode current's 333 ability to traverse the transformer 311 is depicted as capacitances between the primary and secondary sides of the transformer 311.

The system 300 generates a nulling current 337 at values selected to cancel the common mode current 333 from the measurement current 331. The transformer 311 is coupled to the resistive network 313 via the first phase connection 351 and the second phase connection 353 to generate the nulling current 337. The resistive network 313 includes a first resistive element 315 coupled to the first phase connection 351 and an input of an amplifier 318. The resistive network 313 also includes a second resistive element 316 coupled to the second phase connection 353, the first resistive element 315, and the input of the amplifier 318. The resistive elements 315 and 316 may each be resistors that provide resistance along the corresponding wires. The resistances create a resistance ratio for the resistive network 313. Accordingly, during a calibration stage in product manufacture, resistive elements 315 and 316 can be selected to create a resistive ratio for the resistive network 313 that calibrates the nulling current 337 to cancel the common mode current 333. As each transformer 311 across a product line is slightly different, a common mode current 333 for each system 300 is slightly different. As such, the resistive elements 315 and 316 employed may vary from product to product and may be selected to tune the system 300 for complete cancellation of the common mode current 333.

The nulling current 337 is output from the resistive network toward an amplifier 318. The amplifier 318 is any component configured to amplify the power/amplitude of a signal. For example, the amplifier 318 may include an operational amplifier. Accordingly, the amplifier 318 is coupled to the resistive network 313 and receives and amplifies the nulling current 337 for application to the measurement current 331. The amplifier 318 may be powered by the transformer 311. Rectifiers 317 are employed to convert a portion of the power from the transformer 311 into direct current (DC) operating power for the amplifier 318. Rectifiers 317 may be any component that converts AC power into DC power. The rectifiers 317 may be selected as desired to provide power appropriate to the amplifier 318.

The system 300 further includes one or more capacitive elements 319 coupled to the amplifier 318 and the measurement lead containing the common impedance 330. A capacitive element 319 is any component structured to store and release charge, such as a capacitor. The capacitive element(s) are configured for applying the nulling current 337 to the measurement lead to cancel the common mode current 333. As such, by calibrating the system 300 with the appropriate resistive elements 315 and 316 and/or resistive network 313, a nulling current 337 is created and applied to a measurement current 331 to cancel any common mode current 333 occurring due to problems in the ground connection caused by a differential between test and measurement system ground 312 and DUT 320 ground 322.

Figure 4:
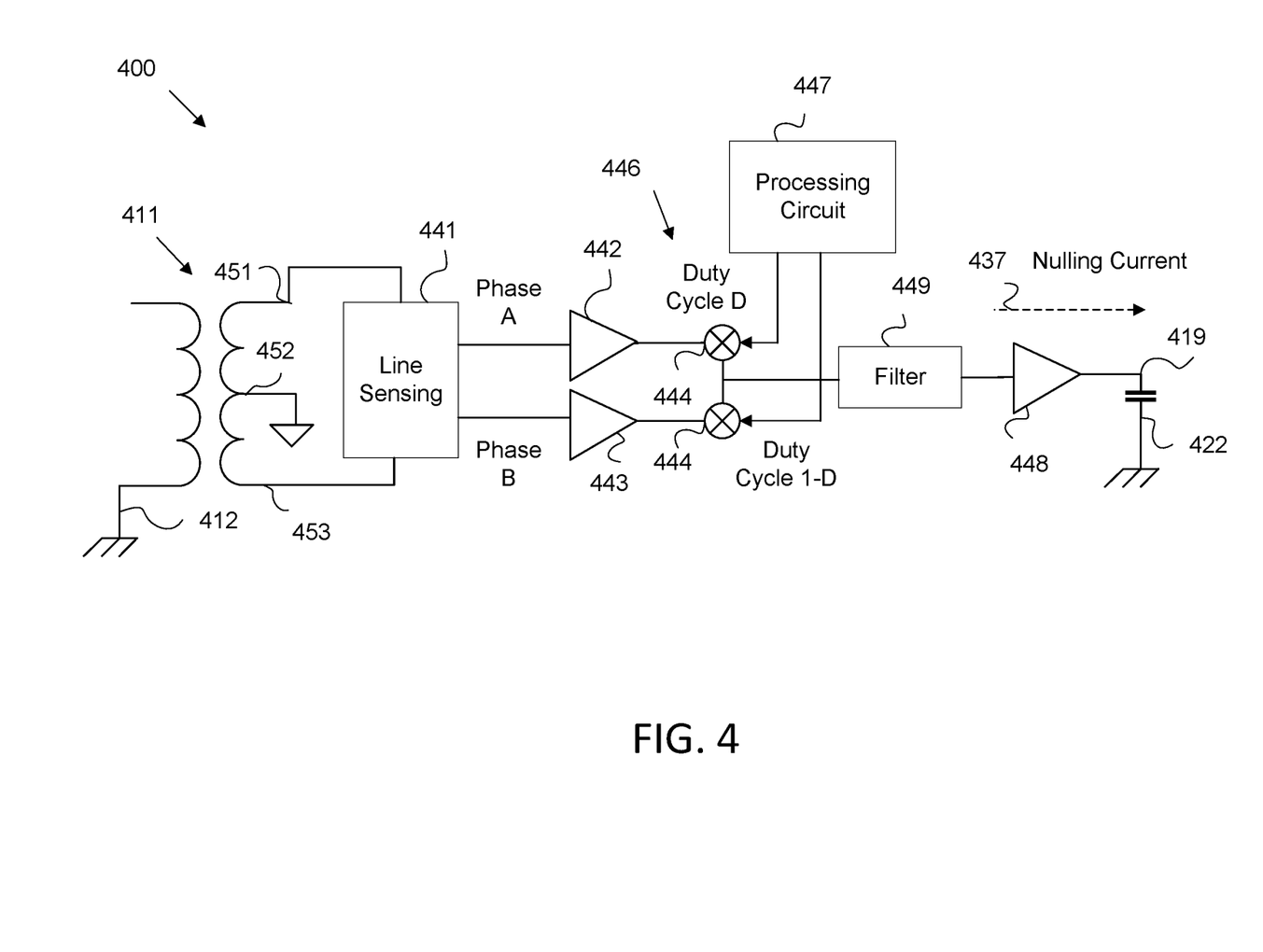
FIG. 4 is a schematic diagram of an aspect of a test and measurement system circuit for employing a switch network to generate a nulling current to cancel a common mode current, in accordance with various embodiments of the present disclosure.

FIG. 4 is a schematic diagram of an aspect of a circuit of a test and measurement system 400 for employing a switch network 446 to generate a nulling current 437 to cancel a common mode current, such as common mode current 333. The system 400 is similar to the system 300, but employs a switch network 446 that operates according to duty cycle(s) to generate the nulling current 437 instead of using a resistive network. The system 400 includes a transformer 411 coupled to a ground 412 on a primary side with a first phase connection 451, a second phase connection 453, and a center connection 452 on a secondary side, which are substantially similar to transformer 311, ground 312, first phase connection 351, second phase connection 353, and center connection 352, respectively. As with system 300, the center connection 452 forwards a measurement current toward a device under test via a measurement lead, and the measurement current includes a common mode current caused by a common impedance with a ground connection, including a DUT ground 422 and ground 412, that alters the measurement current. Such components are substantially similar to system 300 and hence not completely depicted in FIG. 4 for purposes of clarity.

The system 400 further includes at least one line sensing component 441 coupled to the first phase connection 451 and the second phase connection 453. The line sensing component 441 is any device configured to sense the line conditions at a bandwidth that is desirable to become part of the nulling current 437. Line sensing component 441 may be implemented by employing many different mechanisms. For example, the line sensing component 441 may be implemented as a resistive voltage divider or an electrostatic pickup. The line sensing component 441 may also be configured to correct the phase and the amplitude of the output of the transformer 411 as desired for use in the nulling current 437. The system 400 also includes amplifiers 442 and 443, which also amplify the transformer 411 output to further correct signal amplitude for each signal phase (e.g. phase A and phase B).

The system 400 also includes a switch network 446, which includes switches 444. The switch network 446 is coupled to the first phase connection 451 and the second phase connection 453 via the line sensing component 441. The switch network 446 operate based on commands from a processing circuit 447, which may be implemented as a field programmable gate array (FPGA), application specific integrated circuit (ASIC), etc. The processing circuit 447 is configured to operate the switch network 446 to generate the nulling current 437 to cancel the common mode current from the measurement current. For example, the processing circuit 447 may generate the nulling current 437 by operating the switch network 446 to switch between the first phase connection 451 of the transformer 411 and the second phase connection 453 of the transformer 411. The processing circuit 447 operates the switch network 446 switches 444 to switch between the first phase connection 451 and the second phase connection 453 according to a duty cycle calibrated to the apparatus to generate the nulling current 437. In other words, the nulling current 437 is applied to a capacitive element 419, which can be substantially similar to capacitive element 319. Capacitive element 419 does not charge instantly. Accordingly, the switch network 446 can couple current to the capacitive element 419 until a desired charge is reached. The current can then be switched off to prevent the capacitive element 419 from charging beyond the desired level. As such, the amount of charge on the capacitive element 419, and hence the amount of nulling current 437 applied to the common mode current, can be controlled by switching the connection to the transformer 411 outputs as desired. Transformer 411 and capacitive element 419 conduct current, charge, and discharge in a predictable manner. As such, the duty cycle D and a duty cycle 1-D can be determined for each switch 444 during calibration to provide the proper nulling current 437. The duty cycles proportions allow a proportional amount of either phase A or phase B signals to drive the common side of the switch network 446. After the duty cycles are determined (e.g. by the processing circuit 447), they can be saved in memory for use by the system 400 at runtime.

The nulling signal may then be forwarded through a zero phase filter 449. The filter 449 is configured to filter out high frequency content of the signal that is not desirable to be a part of the nulling current 437. Hence, filter 449 may act as a lowpass filter. The filter 449 is selected to preserve a phase of the nulling current 437 by maintaining a constant signal delay. For example, the filter 449 may be selected as a Bessel response type filter. As such, the filter 449 may provide a constant delay for all of the in-band signal content which becomes part of the nulling current 437. Other filter types may be employed, but such filters may introduce distortion (e.g. further signal noise) for some of the inband frequencies.

The system 400 also include a further amplifier 448 configured to amplify the nulling current 437 for application to the measurement current. The nulling current 437 is then applied to the capacitive element 419 coupled to the amplifier 448. The capacitive element 419 may then apply the nulling current 437 to the measurement current to cancel the common mode current.

It should be noted that system 400, from line sensing component 441 to nulling current 437 creation, may preserve the line phase over the bandwidth of interest (e.g. greater than 50 Hertz (Hz) to include other noise artifacts). To the extent that the phase is preserved over the bandwidth of interest, a nulling current 437 may be achieved that perfectly, or completely, cancels the common mode current. To the extent that phase is not preserved, new noise components may be introduced that are not present in the measurement current.

Figure 5:
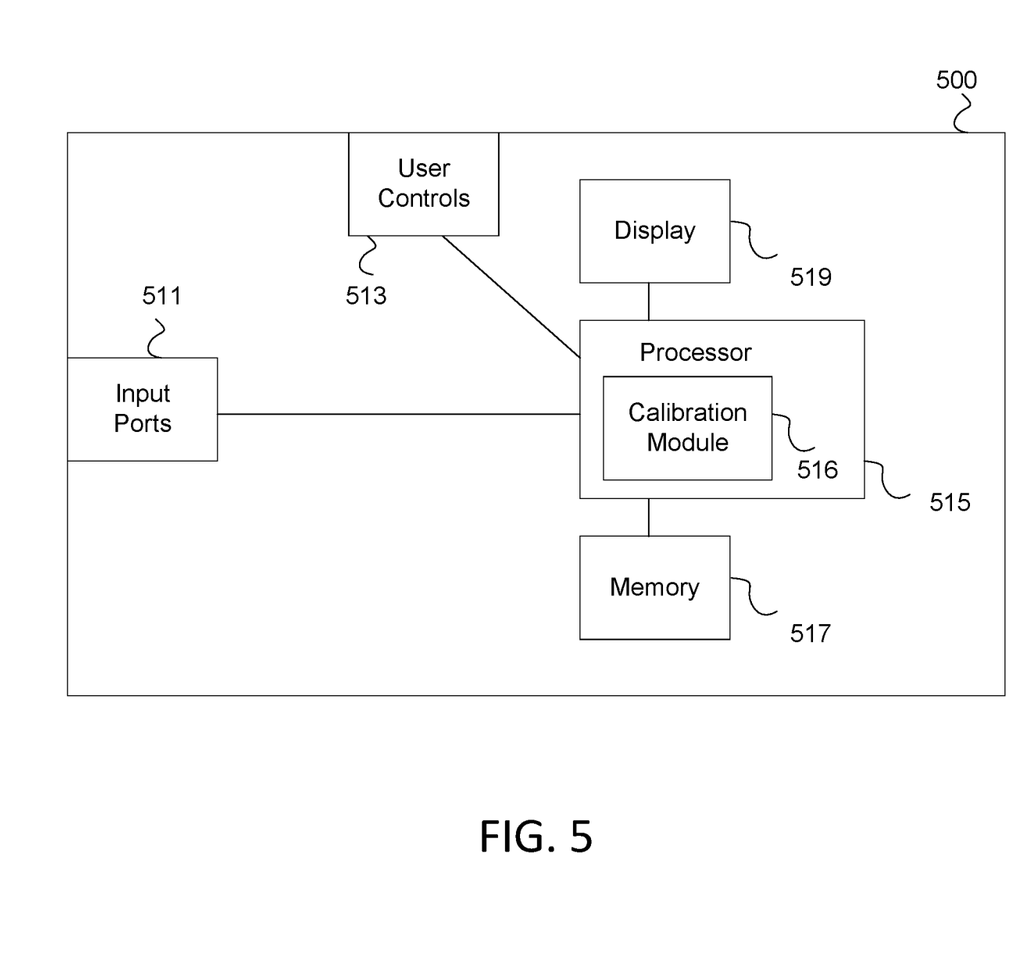
FIG. 5 is a block diagram of an example digital multimeter (DMM) for implementing a test and measurement system, in accordance with various embodiments of the present disclosure.

FIG. 5 is a block diagram of an example DMM 500 for implementing a test and measurement system, such as a DMM 110 with a system 300 and/or 400 for generating a nulling current. DMM 500 may employ a measurement current to measure a DUT and generate a nulling current to cancel a common mode current. DMM 500 may also be configured to implement method 600 and/or any other method disclosed herein. DMM 500 comprises input ports 511 which may be any electrical and/or optical ports, transmitters, receivers, etc. configured to receive one or more measurement leads accept an input signal for testing purposes, such as a measurement current, which may include a common mode current. Input ports 511 may be coupled to measurement circuits, which may comprise amplifiers, samplers, and/or other components for signal sampling and/or signal conditioning. Such signal analysis circuits may be implemented as one or more application specific integrated circuits (ASICs), digital signal processor (DSPs), or other processing circuitry. The measurement circuits may also be configured to store input signal data to memory for further processing. The measurement circuits may be coupled to processor 515, which may be implemented as a general purpose processor, an ASIC, an FPGA, etc. The processor 515 is configured to execute instructions from memory 517 and perform any methods and/or associated steps indicated by the instructions. Memory 517 may be implemented as processor cache, random access memory (RAM), read only memory (ROM), solid state memory, hard disk drive(s), or any other memory type or computer-readable storage media. Memory 517 acts as a computer-readable storage media for storing data, computer program products, and other instructions, and providing such data/products/instruction to the processor 515 for computation as needed.

The processor 515 may comprise a calibration module 516. The calibration module 516 is a processing circuit and/or set of instructions configured to determine, store, and/or employ one or more duty cycles and/or other configuration information for a switching network to generate a nulling current for application to and cancellation of a common mode current. The calibration module 516 is further configured to perform method 600, in whole or in part, and/or any other method disclosed herein, or portion thereof. In some embodiments, calibration module 516 may also be implemented, in whole or in part, in the memory 517, processor 1015, user controls 513, and/or display 519. User controls 513 are coupled to the processor 515. The user controls 513 may comprise setting adjustment knobs, display adjustment controls, or any other controls employable by a user to display or alter a display of a measurement signal on the display 519. The display 519 may be a digital screen or a cathode ray tube based display for displaying results of a tested measurement current/signal, for example as a amperage, a voltage, and/or as a resistance.

Figure 6:
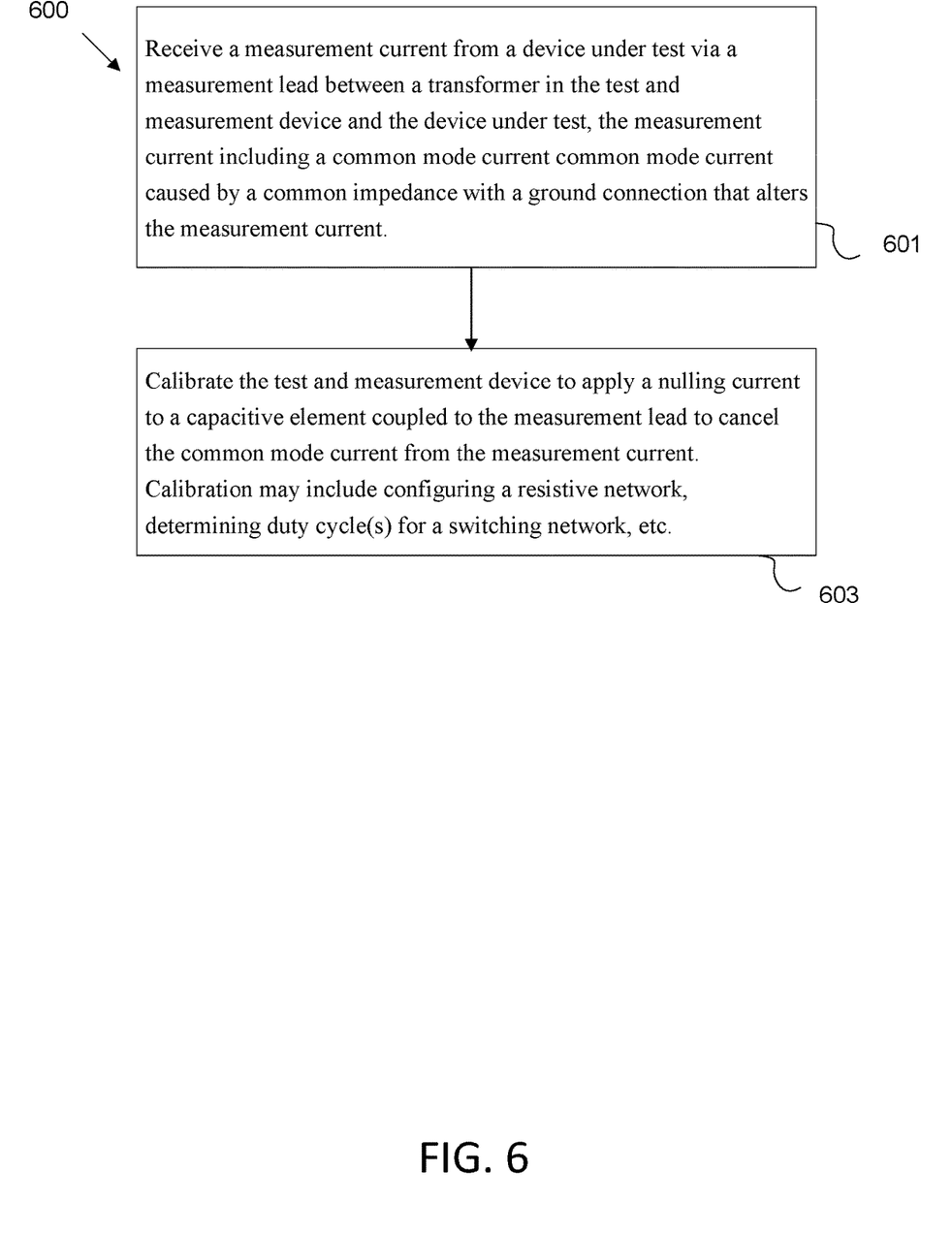
FIG. 6 is a flowchart of an example method for canceling a common mode current by employing a nulling current, in accordance with various embodiments of the present disclosure.

FIG. 6 is a flowchart of an example method 600 for canceling a common mode current by employing a nulling current. For example, method 600 may be employed to calibrate a test and measurement device such as a DMM 110 employing a system 300 and/or 400. At block 601, a measurement current is received from a device under test via a measurement lead. As discussed above, the measurement current may contain a common mode current caused by a common impedance with a ground connection that alters the measurement current. At block 603, the test and measurement device is calibrated to apply a nulling current to a capacitive element coupled to the measurement lead to cancel the common mode current from the measurement current. As noted above, the calibration may include configuring a resistive network, as in system 300, determining duty cycle(s) for a switching network, as in system 400, etc.

For example, when employing a system 300, calibrating the test and measurement device includes coupling a resistive network between the transformer and an amplifier for powering the capacitive element. The resistive network may include a first resistor coupled between a first phase connection of the transformer and the amplifier. The resistive network may also include a second resistor coupled between a second phase connection of the transformer and the amplifier. The calibration may include selecting the resistors to include a ratio of resistance to apply the nulling current to the amplifier.

As another example, when employing system 400, calibrating the test and measurement device may include employing a processing circuit to generate the nulling current by selectively switching between coupling a first phase connection of the transformer to an amplifier for powering the capacitive element and coupling a second phase connection of the transformer to the amplifier for powering the capacitive element. Calibrating the test and measurement device may also include determining a proportional duty cycle for each coupling and saving the proportional duty cycles in memory for use in generating the nulling current. In such a case, a line sensing element may be employed to correct phase and amplitude of the nulling current. Further, the nulling current may be forwarded to the amplifier via a zero phase filter that preserves a phase of the nulling current by maintaining a constant signal delay.

Aspects of the invention may operate on particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the invention may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the invention, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 includes a method implemented in a test and measurement device, the method comprising: receiving a measurement current from a device under test via a measurement lead between a transformer in the test and measurement device and the device under test, the common mode current caused by a common impedance with a ground connection that alters the measurement current; calibrating the test and measurement device to apply a nulling current to the measurement lead to cancel the common mode current from the measurement current.

Example 2 includes the aspects of example 1, in which calibrating the test and measurement device includes coupling a resistive network between the transformer and an amplifier for powering a capacitive element.

Example 3 includes the aspects of examples 1-2, in which the resistive network includes: a first resistor coupled between a first phase connection of the transformer and the amplifier, and a second resistor coupled between a second phase connection of the transformer and the amplifier, the first and second resistors selected to include a ratio of resistance to apply the nulling current to the amplifier.

Example 4 includes the aspects of example 1, in which calibrating the test and measurement device includes employing a processing circuit to generate the nulling current by selectively switching between coupling a first phase connection of the transformer to an amplifier for powering the capacitive element and coupling a second phase connection of the transformer to the amplifier for powering the capacitive element.

Example 5 includes the aspects of example 4, further comprising employing a line sensing element to correct phase and amplitude of the nulling current.

Example 6 includes the aspects of examples 4-5, in which calibrating the test and measurement device further includes determining a proportional duty cycle for each coupling and saving the proportional duty cycles for use in generating the nulling current.

Example 7 includes the aspects of examples 4-6, further comprising forwarding the nulling current to the amplifier via a zero phase filter that preserves a phase of the nulling current by maintaining a constant signal delay.

Example 8 includes an apparatus comprising: a transformer including a first phase connection, a second phase connection, and a center connection, the center connection configured to forward a measurement current toward a device under test via a measurement lead, the measurement current including a common mode current caused by a common impedance with a ground connection that alters the measurement current; and a resistive network coupled to the first phase connection and the second phase connection to generate a nulling current to cancel the common mode current from the measurement current.

Example 9 includes the aspects of example 8, further comprising an amplifier coupled to the resistive network to amplify the nulling current for application to the measurement current.

Example 10 includes the aspects of examples 8-9, further comprising a capacitive element coupled to the amplifier and the measurement lead for applying the nulling current to the measurement lead.

Example 11 includes the aspects of examples 8-10, further comprising rectifiers coupling operating power to the amplifier from the transformer.

Example 12 includes the aspects of examples 8-11, in which the resistive network includes: a first resistive element coupled to the first phase connection and an input of the amplifier, and a second resistive element coupled to the second phase connection, the first resistive element, and the input of the amplifier.

Example 13 includes the aspects of example 12, in which the first resistive element and the second resistive element each include a resistance creating a resistance ratio for the resistive network, the resistance ratio selected to calibrate the nulling current to cancel the common mode current.

Example 14 includes an apparatus comprising: a transformer including a first phase connection, a second phase connection, and a center connection, the center connection configured to forward a measurement current toward a device under test via a measurement lead, the measurement current including a common mode current caused by a common impedance with a ground connection that alters the measurement current; a switch network coupled to the first phase connection and the second phase connection; and a processing circuit for operating the switch network to generate a nulling current to cancel the common mode current from the measurement current.

Example 15 includes the aspects of example 14, in which the processing circuit is configured to generate the nulling current by operating the switch network to switch between the first phase connection of the transformer and the second phase connection of the transformer.

Example 16 includes the aspects of examples 14-15, in which the switch network operates according to a duty cycle calibrated to the apparatus to generate the nulling current.

Example 17 includes the aspects of examples 14-16, further comprising a zero phase filter configured to preserve a phase of the nulling current by maintaining a constant signal delay.

Example 18 includes the aspects of examples 14-17, further comprising and amplifier configured to amplify the nulling current for application to the measurement current.

Example 19 includes the aspects of examples 14-18, further comprising a capacitive element coupled to the amplifier, the capacitive element configured to apply the nulling current to the measurement current to cancel the common mode current.

Example 20 includes the aspects of examples 14-19, further comprising a line sensing element coupled to the first phase connection and the second phase connection, the line sensing element configured to correct phase and amplitude of the nulling current.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

The aspects of the present disclosure are susceptible to various modifications and alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific aspects described herein unless expressly limited. As such, the present disclosure is intended to cover all modifications, equivalents, and alternatives of the described aspects in light of the attached drawings and claims.

References in the specification to aspect, example, embodiment, implementation etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

Although specific aspects of the invention have been illustrated and described for purposes of illustration, it will be understood that various modifications may be made without departing from the spirit and scope of the invention. Accordingly, the invention should not be limited except as by the appended claims.

We claim:

1. A method implemented in a test and measurement device, the method comprising:
    forwarding a measurement current from a transformer in the test and measurement device to a device under test, the transformer including a secondary side having a first phase connection, a second phase connection, and a center connection, the center connection configured to forward the measurement current toward the device under test via a measurement lead that couples the transformer in the test and measurement device with the device under test;
    receiving the measurement current from the device under test via the measurement lead, the measurement current including a common mode current caused by a common impedance with a ground connection that alters the measurement current;
    calibrating the test and measurement device to apply a nulling current to the measurement lead to cancel the common mode current from the measurement current,
    in which calibrating the test and measurement device includes employing a processing circuit to generate the nulling current by selectively switching between coupling the first phase connection of the transformer to an amplifier for powering a capacitive element and coupling the second phase connection of the transformer to the amplifier for powering the capacitive element.

2. The method of claim 1, further comprising employing a line sensing element to correct phase and amplitude of the nulling current.

3. The method of claim 1, in which calibrating the test and measurement device further includes determining a proportional duty cycle for each coupling and saving the proportional duty cycles for use in generating the nulling current.

4. The method of claim 1, further comprising forwarding the nulling current to the amplifier via a zero phase filter that preserves a phase of the nulling current by maintaining a constant signal delay.

5. An apparatus comprising:
    a transformer including a secondary side having a first phase connection, a second phase connection, and a center connection, the center connection configured to forward a measurement current toward a device under test via a measurement lead, the measurement current including a common mode current caused by a common impedance with a ground connection that alters the measurement current;
    a switch network coupled to the first phase connection and the second phase connection; and
    a processing circuit for operating the switch network to generate a nulling current to cancel the common mode current from the measurement current.

6. The apparatus of claim 5, in which the processing circuit is configured to generate the nulling current by operating the switch network to switch between the first phase connection of the transformer and the second phase connection of the transformer.

7. The apparatus of claim 6, in which the switch network operates according to a duty cycle calibrated to the apparatus to generate the nulling current.

8. The apparatus of claim 5, further comprising a zero phase filter configured to preserve a phase of the nulling current by maintaining a constant signal delay.

9. The apparatus of claim 8, further comprising and amplifier configured to amplify the nulling current for application to the measurement current.

10. The apparatus of claim 9, further comprising a capacitive element coupled to the amplifier, the capacitive element configured to apply the nulling current to the measurement current to cancel the common mode current.

11. The apparatus of claim 5, further comprising a line sensing element coupled to the first phase connection and the second phase connection, the line sensing element configured to correct phase and amplitude of the nulling current.

* * * * *